United States Patent
Welch et al.

(10) Patent No.: US 8,676,540 B1
(45) Date of Patent: Mar. 18, 2014

(54) METHODS FOR AUTOMATIC TRIGGER THRESHOLD ADJUSTMENT

(75) Inventors: Benjamin J. Welch, Albuquerque, NM (US); Michael E. Partridge, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 1166 days.

(21) Appl. No.: 11/954,024

(22) Filed: Dec. 11, 2007

(51) Int. Cl.
G06F 19/00 (2011.01)
G01P 15/08 (2006.01)
G01R 19/25 (2006.01)

(52) U.S. Cl.
CPC ............ *G01P 15/08* (2013.01); *G01R 19/2506* (2013.01)
USPC ....................................... 702/187

(58) Field of Classification Search
CPC .............................. G01P 15/08; G01R 19/2506
USPC ................................................ 702/187
See application file for complete search history.

(56) References Cited

U.S. PATENT DOCUMENTS

| 3,569,633 | A | * | 3/1971 | Brahman | 381/11 |
| 3,573,817 | A | * | 4/1971 | Akers | 340/522 |
| 4,704,691 | A | * | 11/1987 | Blair | 702/124 |
| 5,233,962 | A | * | 8/1993 | Fodale et al. | 123/406.3 |
| 6,560,494 | B1 | | 5/2003 | Soto et al. | |
| 6,701,276 | B2 | * | 3/2004 | Kueblbeck et al. | 702/145 |
| 6,707,474 | B1 | * | 3/2004 | Beck et al. | 715/771 |
| 6,781,688 | B2 | * | 8/2004 | Kren et al. | 356/237.4 |
| 6,782,298 | B2 | | 8/2004 | Soto et al. | |
| 6,882,944 | B2 | * | 4/2005 | Fujisaku | 702/66 |
| 8,098,485 | B2 | * | 1/2012 | Weaver et al. | 361/679.01 |
| 2005/0078775 | A1 | * | 4/2005 | Hellmark et al. | 375/345 |
| 2005/0093582 | A1 | * | 5/2005 | Bock | 327/77 |
| 2006/0084390 | A1 | * | 4/2006 | Salonaho et al. | 455/67.11 |
| 2006/0149541 | A1 | * | 7/2006 | Jaklitsch et al. | 704/226 |
| 2007/0028920 | A1 | | 2/2007 | Acker | |
| 2007/0161916 | A1 | | 7/2007 | Zantos et al. | |
| 2007/0297548 | A1 | * | 12/2007 | Tsukamoto et al. | 375/354 |

OTHER PUBLICATIONS

Asumadu J.A. et al., "A 3-Axis Acceleration Sensor Data Acquisition Instrument System", IMTC 2004, Instrumentation and Technology Conferenct, Como, Italy, May 18-20, 2004.

* cited by examiner

*Primary Examiner* — Jonathan C Teixera Moffat
*Assistant Examiner* — Regis Betsch
(74) *Attorney, Agent, or Firm* — Michael A. Beckett

(57) ABSTRACT

Methods are presented for adjusting trigger threshold values to compensate for drift in the quiescent level of a signal monitored for initiating a data recording event, thereby avoiding false triggering conditions. Initial threshold values are periodically adjusted by re-measuring the quiescent signal level, and adjusting the threshold values by an offset computation based upon the measured quiescent signal level drift. Re-computation of the trigger threshold values can be implemented on time based or counter based criteria. Additionally, a qualification width counter can be utilized to implement a requirement that a trigger threshold criterion be met a given number of times prior to initiating a data recording event, further reducing the possibility of a false triggering situation.

4 Claims, 3 Drawing Sheets ered as a function of time or sample number in the memory device 110. A bus 112 (e.g. serial, parallel, USB etc.) can be incorporated in the apparatus to download data to an external processor (e.g. computer, pc or laptop) for processing and analysis of the recorded data.

METHODS FOR AUTOMATIC TRIGGER THRESHOLD ADJUSTMENT

STATEMENT REGARDING FEDERALLY SPONSORED RESEARCH OR DEVELOPMENT

The United States Government has certain rights in this invention pursuant to Department of Energy Contract No. DE-AC04-94AL85000 with Sandia Corporation.

FIELD OF THE INVENTION

The invention generally relates to methods for adjusting trigger threshold levels for data acquisition, data logging and data recording systems. The method additionally relates to methods for adjusting trigger threshold levels to compensate for signal level drift for those signals being monitored to trigger a data recording event.

BACKGROUND OF THE INVENTION

Data recording, also referred to herein as data acquisition and/or data logging, can be used to record and store information gathered from sensors, generally over a time period of interest. Due to limitations that can exist with regards to the amount of information that can be stored by data recording systems, or the desire to minimize the amount of data to be subsequently analyzed, it can be desirable to trigger, i.e. initiate a data recording event only upon the occurrence of a specific condition or event that signals the beginning of the time period of interest.

For example, one or more trigger signals (e.g. output signals from one or more sensors) can be monitored and a data recording event initiated only when the level of a monitored trigger signal meets a given criteria, for example, whereat the signal level falls below or rises above a trigger threshold value. In this manner the memory within a data recording apparatus can be more efficiently allotted to the time period of interest, and recording of and subsequent analysis of sensor data that may not be of particular interest can be avoided.

False triggering of a data recording event can occur if the quiescent, i.e. background level of the monitored sensor signal drifts over time, and the amount of quiescent signal drift is sufficient to cause the apparent signal level to exceed a triggering criteria. Quiescent level signal drift is defined herein to be a change in the signal level output from a sensor due to an influence or environmental parameter other than the parameter the sensor is intended to measure. In one non-limiting example, it has been found that temperature deviations can cause quiescent level signal drift in some acceleration sensors. The present invention provides methods to automatically adjust trigger threshold values (i.e. triggering criteria) to compensate for drift in the quiescent level of the trigger signal, thereby avoiding false triggering of data recording events which could cause a data recording system to record data during periods other than the period of interest.

BRIEF DESCRIPTION OF THE DRAWINGS

The accompanying drawings, which are incorporated in and form part of the specification, illustrate several embodiments of the present invention and, together with the description, serve to explain the principles of the invention. The drawings provided herein are not drawn to scale.

DETAILED DESCRIPTION OF THE INVENTION

Data recording has been employed in the medical and engineering fields, for example see Zantos et al., US Patent Application Publication No. 2007/0161916 and Soto et al., U.S. Pat. No. 6,782,298 the contents of each of which are incorporated herein by reference, to collect/record data obtained from sensors over a period of time of interest. It can be desired to initiate a data recording event only upon a trigger signal achieving one or more triggering criterion, to conserve the memory of the data recording system for the time period of interest and obviate the need to analyze or parse data that is not of interest.

Figure 1:
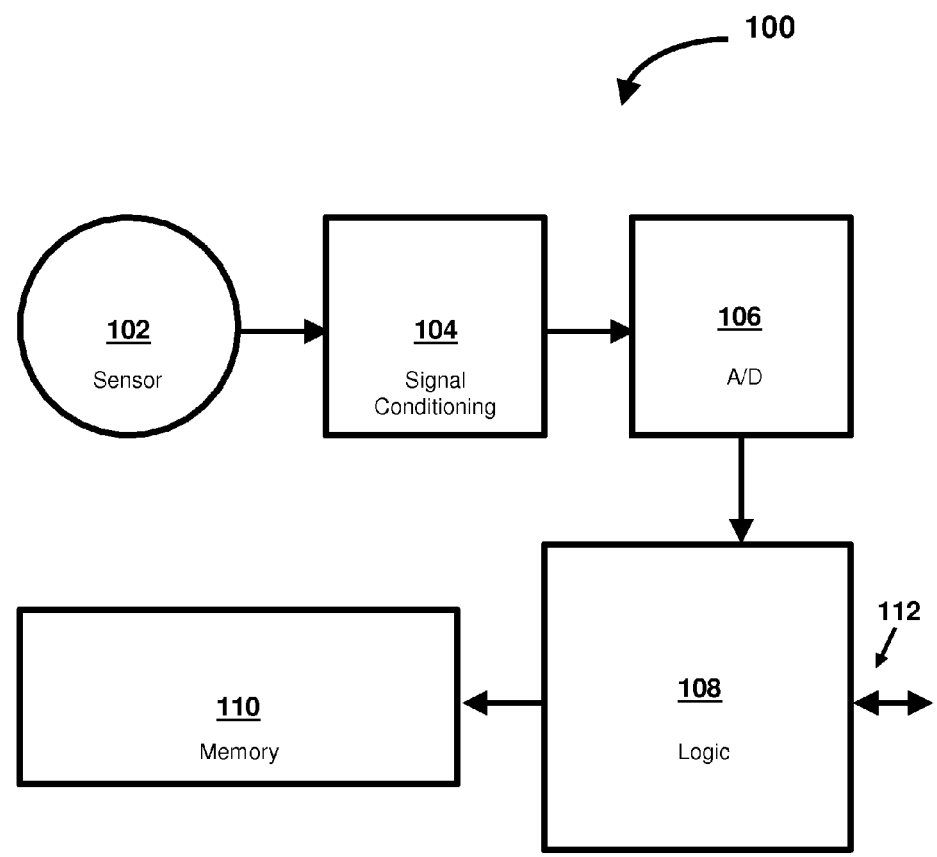
FIG. 1 is a schematic block diagram of a channel of an exemplary data recording apparatus.

FIG. 1 is a schematic block diagram of a channel 100 of an exemplary data recording apparatus. A data recording apparatus generally comprises multiple channels 100, each channel comprising a sensor 102 monitoring a parameter such as temperature, acceleration, force, strain, pressure, flow rate, electrical continuity etc. The output of sensor 102 can be processed by signal conditioning circuits 104 and analog to digital ("A/D") converter 106. A logic device 108 such as a processor, microprocessor, gate array or programmable logic device, can be employed to monitor the digitally converted output of the sensor 102 from the A/D 106, and control the overall functionality of the channel 100. Logic device 108 can for example, monitor the level of the output signal of the sensor 102 to determine when the level of the output signal from the sensor meets a trigger criterion to subsequently initiate recording of the sensor's output for example, by storing the sensor's output in a memory device 110. Generally the signal level output by the sensor (digitized by the A/D 106) will be stored as a function of time or sample number in the memory device 110. A bus 112 (e.g. serial, parallel, USB etc.) can be incorporated in the apparatus to download data to an external processor (e.g. computer, pc or laptop) for processing and analysis of the recorded data.

It can occur that the output signal of a sensor 102 being monitored to trigger a data recording event can drift, that is, the level of the output signal can change due to extraneous effects (e.g. such as temperature effecting the output of an acceleration sensor) even though the environmental parameter the sensor is monitoring is not necessarily changing. The output level of a sensor sensing a non-changing (i.e. steady state) parameter is said to be the quiescent signal level of the sensor and ideally, this does not change due to extraneous effects.

Figure 2A:
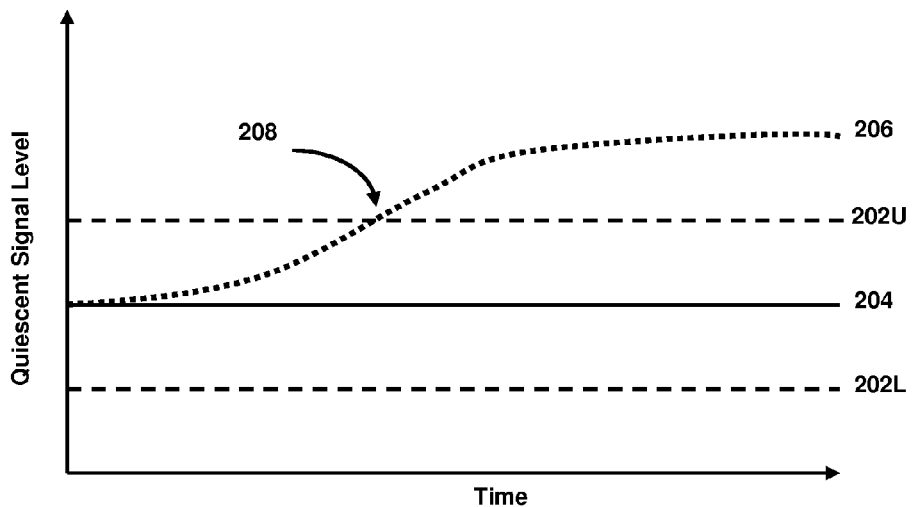
FIG. 2A is a schematic illustration of exemplary drift in a trigger signal, causing a false triggering condition.

FIG. 2A illustrates the ideal case wherein the quiescent level of the output signal 204 of a sensor 102 sensing a non-changing, steady state parameter, is itself essentially non-changing. In the ideal case, the quiescent level of the output signal 204 is constant over time. By constant, it is meant that deviations in the output signal 204 are insignificant with respect to trigger threshold levels such as an upper trigger threshold level 202U and a lower trigger threshold level 202L.

FIG. 2A additionally illustrates the non-ideal case wherein the quiescent level of the output signal 206 of a sensor 102 sensing a non-changing, steady state parameter is changing, due to the effect of an extraneous variable (e.g. such as temperature, aging and charging effects in an acceleration sensor). This effect is referred to as drift in the quiescent level of the output signal 206. Drift in the quiescent level of the output signal 206 can be severe enough to cause the quiescent level of the sensor to meet or exceed a fixed trigger threshold criterion, such as exceeding the upper trigger threshold 202U at point 208 in the exemplary diagram. This undesirable situation can cause a data recording channel 100 to falsely trigger and initiate the data recording event. A problem that the present invention cures is that this undesirable situation can be avoided if the triggering criterion, for example the upper and lower trigger threshold limits 202U and 202L are adjusted to compensate for the drift in the quiescent level of the output signal 206.

Figure 2B:
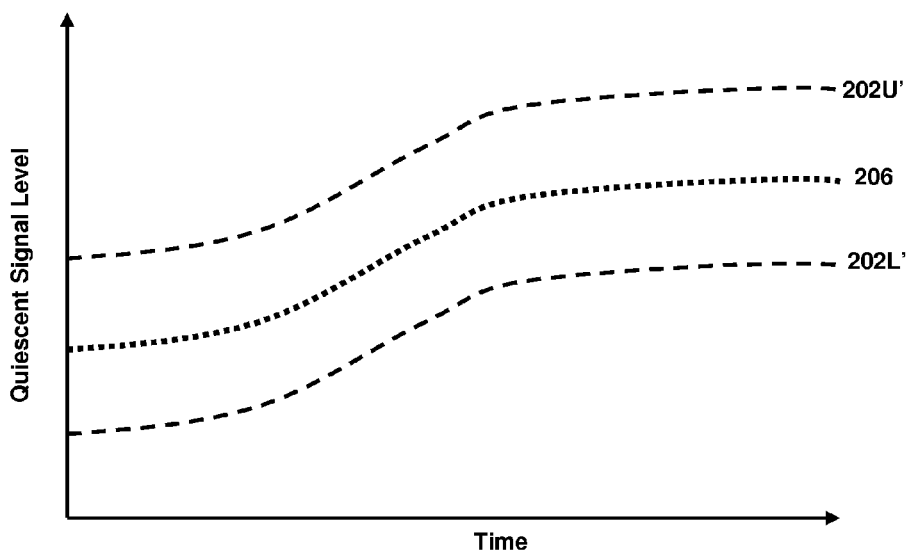
FIG. 2B is a schematic illustration a false triggering condition can be avoided by continuous adjustment of trigger threshold values.

FIG. 2B illustrates how the methods of the present invention can be utilized to avoid a false triggering situation due to drift in the quiescent level of the output signal 206, by adjusting the upper and lower trigger threshold limits 202U' and 202L'. Upper and lower trigger threshold limits 202U' and 202L' are periodically or continuously adjusted by a computed amount (e.g. offset) based upon the magnitude of the computed drift in the signal 206. By adjusting the upper and lower trigger threshold limits 202U' and 202L', the drift in the quiescent level of the output signal 206 does not cause the quiescent level to meet or exceed a triggering criterion, i.e. the quiescent level 206 does not "cross" 202U' or 202L'. As described below, the methods of the present invention allow (inter alia) for continuously adjusting trigger threshold values, e.g. triggering criterion, up or down to track drift that may occur in the quiescent output signal 206 of a sensor 102. The present methods are applicable where a trigger criterion is based upon a singular threshold value, for example, in monitoring a trigger signal level for a high or low condition, or where a trigger criterion is based upon multiple threshold values, for example, in monitoring a signal level for achieving a value outside of a range established about the quiescent level for example, as illustrated by the criterion 202U' and 202L'. The methods of the present invention can be utilized in data recording apparatus and systems, as exemplified by FIG. 1, to avoid false triggering situations caused by drift in the trigger signal quiescent level.

Figure 3:
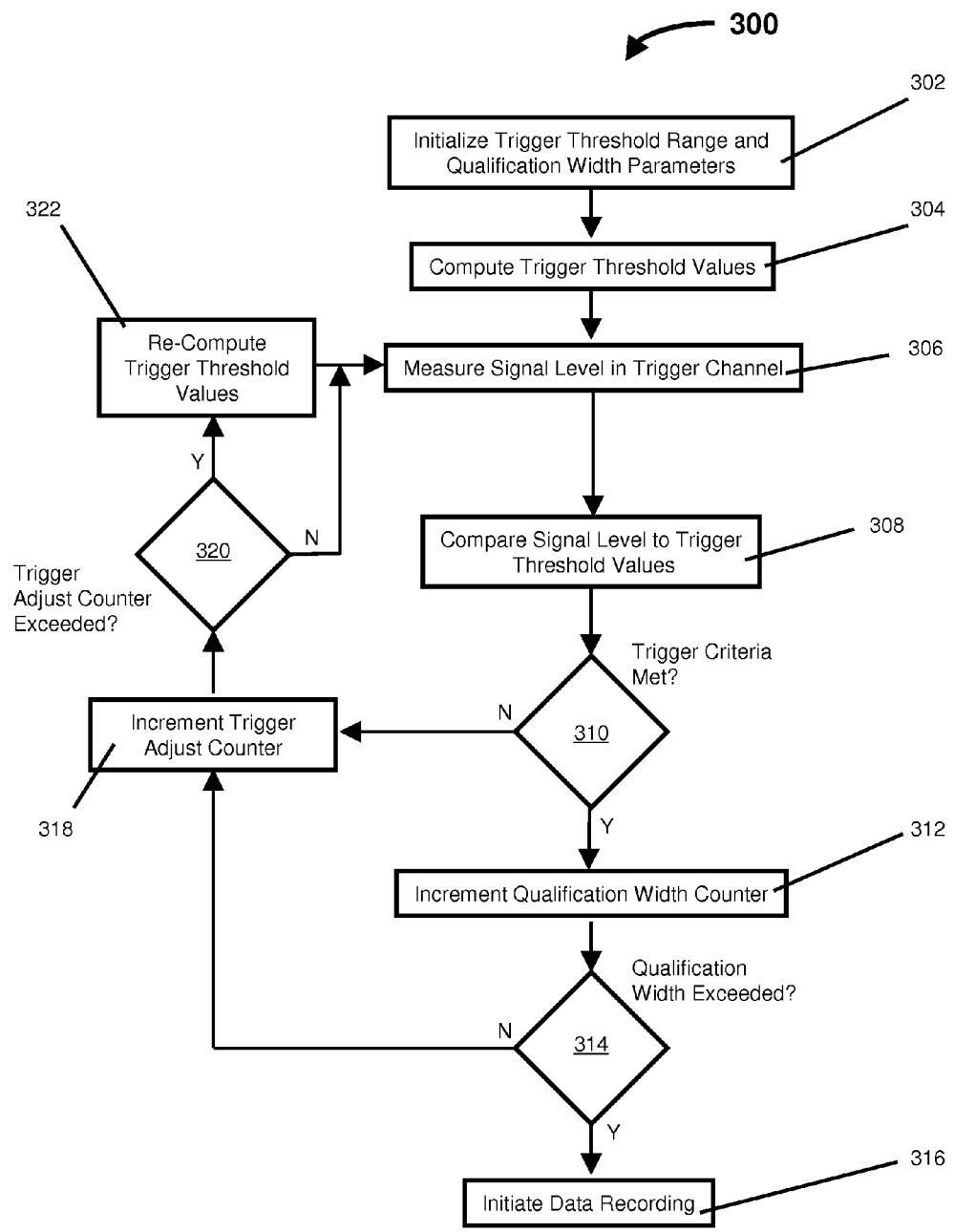
FIG. 3 is a schematic flow diagram of an embodiment of a method, according to the present invention.

FIG. 3 is a schematic flow diagram of an embodiment of a method 300, according to the present invention. In this non-limiting exemplary embodiment, a data recording channel such as illustrated in FIG. 1 can be initialized at step 302 with parameters establishing a trigger criterion. In this example, trigger threshold range and qualification width parameters can be downloaded or otherwise input for each trigger channel in a data recording apparatus. A trigger threshold range parameter can be a value added to and subtracted from the quiescent level of a trigger signal to create high and low trigger thresholds, effectively creating a threshold window. The triggering criterion being that upon a measured value of the signal level exceeding the upper or dropping below the lower limit, a trigger condition exists. A qualification width parameter can additionally be used to establish a minimum number of signal level measurements meeting a triggering criterion that must be met prior to initiating a data recording event. In typical practice, for each occurrence where a trigger criterion is met a counter (e.g. a qualification width counter) can be incremented and conversely the counter can be decremented for an occurrence when the signal is within the threshold window. The use of a qualification width parameter can prevent a false triggering event due to noise or other spurious signal in the trigger channel.

At step 304 initial trigger threshold values are computed or determined. This can be accomplished by obtaining one or more measurements of the quiescent signal level in the trigger channel, or by direct input of a starting value. The trigger threshold values can be computed based upon quiescent signal level and threshold range parameter. Typically, this can involve taking an average of measurements of the quiescent signal level and adding and subtracting the threshold range parameter from the averaged quiescent signal level to obtain high and low trigger threshold values.

At step 306 a measurement (e.g. one or more) of the signal level in the trigger channel is obtained. At step 308 the measurement obtained in step 306 is compared to the computed trigger threshold values. At step 310 if a trigger criterion has been met at, a qualification width counter can be incremented at 312. At step 314 the value in the qualification width counter is compared to the qualification width parameter and if the qualification width is exceeded, a data recording event is initiated at step 316.

If at step 310 a trigger criterion has not been met, a trigger adjustment counter can be incremented at step 318. At step 320 the value in the trigger adjustment counter is compared to a trigger adjustment parameter and if the value is not exceeded, the method returns to step 306 and one or more new measurements of the signal level are obtained. If at step 320 the value in the trigger adjustment counter is compared to a trigger adjustment parameter and the value is exceeded, the trigger threshold values are re-computed at step 322. Typically this is accomplished by averaging the current measurement of the quiescent signal level with a number of previously obtained quiescent signal level measurements. A trigger adjustment parameter and counter or a timer can be used in this manner to periodically re-compute the trigger threshold values therefore compensating the trigger threshold values for quiescent level drift that may occur in the monitored signal level. In a similar loop, if the qualification width is not exceeded at step 314, the method progresses to step 318 and continues as described above.

In a typical application, it has been found that a plurality of periodic adjustments can be made to the trigger threshold values at step 322 prior to a qualification width being exceeded and a data recording event initiated. The present methods have been used to adjust trigger threshold values and provide for the trigger threshold values to "track" the drift in the quiescent level output from an environmental sensor (e.g. an accelerometer due to the effects of a change in temperature) as illustrated in FIG. 2B thereby avoiding false triggering of a data recording apparatus.

The above described exemplary embodiments present several variants of the invention but do not limit the scope of the invention. Those skilled in the art will appreciate that the present invention can be implemented in other equivalent ways. The actual scope of the invention is intended to be defined in the following claims.

What is claimed is:

1. A method to adjust one or more trigger threshold values to compensate for quiescent level drift in a signal monitored to initiate a data recording event on a data recording apparatus, the method comprising:

inputting into the data recording apparatus at least one of a trigger threshold range parameter or a qualification width parameter for one or more trigger channels;

measuring one or more quiescent electrical levels of the signal to obtain one or more first measurements and distinguishing between a trigger threshold adjustment signal and a data recording event signal by:

computing the one or more trigger threshold values based upon the one or more first measurements of the quiescent level of the signal and the trigger threshold range parameter to create high and low trigger threshold values comprising a threshold window for each trigger channel;

measuring one or more second quiescent electrical levels of the signal to obtain one or more second measurements;

comparing the one or more second measurements of the quiescent level of the signal to the threshold window for each channel;

wherein when the one or more second measurements of the quiescent level of the signal does not exceed the threshold window for each channel, re-computing the one or more trigger threshold values based upon a mean that is calculated of the one or more first and second measurements of the quiescent level of the signal and the mean offset by the trigger threshold range parameter, thereby initiating a trigger threshold adjustment by adjusting the threshold window to compensate for the quiescent level drift in the signal; and incrementing a qualification width counter when the one or more second measurements of the quiescent level of the signal exceeds the threshold window or decrementing the qualification width counter when the one or more second measurements of the quiescent level of the signal does not exceed the threshold window for each channel; and initiating the data recording event when the qualification width counter exceeds the qualification width parameter of any of the channels.

2. The method of claim 1 further comprising the step of initializing the data recording apparatus performing the data recording event.

3. The method of claim 1 further comprising the steps of:
incrementing a trigger adjustment counter of the data recording apparatus; and
re-computing the one or more trigger threshold values when the trigger adjustment counter equals an adjustment reference value.

4. The method of claim 3 further comprising the step of initializing the data recording apparatus performing the data recording event with the adjustment reference value.

* * * * *